US009834845B2

(12) United States Patent
Imamura et al.

(10) Patent No.: US 9,834,845 B2
(45) Date of Patent: Dec. 5, 2017

(54) SURFACE-COATED CUTTING TOOL

(71) Applicant: SUMITOMO ELECTRIC HARDMETAL CORP., Itami-shi (JP)

(72) Inventors: Shinya Imamura, Sorachi-gun (JP);
Hideaki Kanaoka, Sorachi-gun (JP);
Anongsack Paseuth, Sorachi-gun (JP);
Takanori Detani, Sorachi-gun (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 0 days.

(21) Appl. No.: 15/101,858

(22) PCT Filed: Aug. 28, 2015

(86) PCT No.: PCT/JP2015/074506
§ 371 (c)(1),
(2) Date: Jun. 3, 2016

(87) PCT Pub. No.: WO2017/037797
PCT Pub. Date: Mar. 9, 2017

(65) Prior Publication Data
US 2017/0191169 A1 Jul. 6, 2017

(51) Int. Cl.
B23B 27/14 (2006.01)
C23C 28/04 (2006.01)
(Continued)

(52) U.S. Cl.
CPC .......... C23C 28/044 (2013.01); B23B 27/148 (2013.01); C23C 16/308 (2013.01);
(Continued)

(58) Field of Classification Search
USPC .......... 51/307, 309; 428/212, 216, 336, 698, 428/601, 702, 704; 407/119
See application file for complete search history.

(56) References Cited

U.S. PATENT DOCUMENTS 7,442,433 B2 * 10/2008 Honma ................ C23C 16/30
428/216
2002/0122701 A1 9/2002 Ljungberg et al.
(Continued)

FOREIGN PATENT DOCUMENTS

JP 2002-205205 A 7/2002
JP 2004-284003 A 10/2004
(Continued)

OTHER PUBLICATIONS

International Search Report in PCT International Application No. PCT/JP2015/074506, dated Oct. 6, 2015.

Primary Examiner — Archene Turner
(74) Attorney, Agent, or Firm — Venable LLP; Michael A. Sartori; Kerri M. Patterson

(57) ABSTRACT

A coating included in a surface-coated cutting tool according to the present invention has an $\alpha$-$Al_2O_3$ layer. In a 15-$\mu$m square color map of a processed surface in parallel to a surface of the $\alpha$-$Al_2O_3$ layer, an area $A_1$ occupied by coarse crystal grains A is $\leq 50\%$ and an area $A_2$ in the area $A_1$ occupied by crystal grains having a (001) plane orientation is $\geq 90\%$, an area $B_1$ occupied by medium-sized crystal grains B of $\alpha$-$Al_2O_3$ is 20 to 50%, an area $B_2$ in the area $B_1$ occupied by crystal grains having the (001) plane orientation is $\geq 90\%$, an area $C_1$ occupied by fine crystal grains C of $\alpha$-$Al_2O_3$ is 10 to 50%, an area $C_2$ in the area $C_1$ occupied by crystal grains having the (001) plane orientation is $\geq 50\%$.

6 Claims, 9 Drawing Sheets

(51) Int. Cl.
*C23C 16/36* (2006.01)
*C23C 16/30* (2006.01)
*C23C 16/40* (2006.01)
*C23C 16/34* (2006.01)

(52) U.S. Cl.
CPC .............. *C23C 16/34* (2013.01); *C23C 16/36* (2013.01); *C23C 16/403* (2013.01); *C23C 28/042* (2013.01)

(56) References Cited

U.S. PATENT DOCUMENTS

| | | |
|---|---|---|
| 2004/0144302 A1 | 7/2004 | Ljungberg et al. |
| 2004/0224159 A1 | 11/2004 | Oshika et al. |
| 2005/0042482 A1* | 2/2005 | Okada .................... C23C 16/30 |
| | | 428/698 |
| 2007/0116985 A1* | 5/2007 | Osada ................... C23C 16/403 |
| | | 428/701 |

FOREIGN PATENT DOCUMENTS

| | | | |
|---|---|---|---|
| JP | 2010-207946 A | | 9/2010 |
| JP | 2012-144766 A | | 8/2012 |
| JP | 2013-188833 | * | 9/2013 |

\* cited by examiner

SURFACE-COATED CUTTING TOOL

TECHNICAL FIELD

The present invention relates to a surface-coated cutting tool.

BACKGROUND ART

A surface-coated cutting tool having a coating formed on a base material has conventionally been used. For example, Japanese Patent Laying-Open No. 2004-284003 (PTD 1) discloses a surface-coated cutting tool having a coating including an $\alpha$-$Al_2O_3$ layer in which a total area of crystal grains showing a crystal orientation of a (0001) plane is 70% or higher when viewed in a direction of normal to a surface of the layer in a plan view.

Japanese Patent Laying-Open No. 2010-207946 (PTD 2) discloses a surface-coated cutting tool having a coating including an $\alpha$-$Al_2O_3$ layer in which crystal grains observed at a surface have a specific size range when viewed in a direction of normal to a surface of the layer in a plan view.

CITATION LIST

Patent Document

PTD 1: Japanese Patent Laying-Open No. 2004-284003
PTD 2: Japanese Patent Laying-Open No. 2010-207946

SUMMARY OF INVENTION

Technical Problem

In PTDs 1 and 2, with the coating including the $\alpha$-$Al_2O_3$ layer constructed as above, improvement in mechanical characteristics such as resistance to wear and resistance to breakage of a surface-coated cutting tool and resultant longer life of a cutting tool are expected.

In recent working by cutting, however, a speed and efficiency have become high, load imposed on a cutting tool has increased, and life of the cutting tool has disadvantageously become short. Therefore, further improvement in mechanical characteristics of a coating on the cutting tool and longer life of the cutting tool have been demanded.

The present disclosure was made in view of such circumstances, and an object thereof is to provide a surface-coated cutting tool achieving improved mechanical characteristics of a coating and longer life of the cutting tool.

Solution to Problem

A surface-coated cutting tool according to one embodiment of the present disclosure is a surface-coated cutting tool including a base material and a coating formed on the base material, and the coating has an $\alpha$-$Al_2O_3$ layer containing a plurality of crystal grains of $\alpha$-$Al_2O_3$. When respective crystal orientations of the crystal grains are specified by performing electron beam backscattering diffraction (EBSD) analyses with a field emission-type scanning microscope (FE-SEM) on a processed surface which is in parallel to a surface of the $\alpha$-$Al_2O_3$ layer and is obtained by removing the $\alpha$-$Al_2O_3$ layer located in a region extending from the surface by a length not smaller than 0.1 μm and not greater than 0.5 μm in a depth direction and a 15-μm square color map is prepared based on the crystal orientations, in the color map, an area $A_1$ occupied by crystal grains A of $\alpha$-$Al_2O_3$ having a particle size not smaller than 1 μm and not greater than 3 μm is equal to or less than 50% and an area $A_2$ in the area $A_1$ occupied by the crystal grains having a normal direction of a (001) plane within ±10° with respect to a normal direction of the processed surface is equal to or more than 90%, an area $B_1$ occupied by crystal grains B of $\alpha$-$Al_2O_3$ having a particle size not smaller than 0.5 μm and less than 1 μm is equal to or more than 20% and equal to or less than 50% and an area $B_2$ in the area $B_1$ occupied by the crystal grains having a normal direction of the (001) plane within ±10° with respect to the normal direction of the processed surface is equal to or more than 90%, an area $C_1$ occupied by crystal grains C of $\alpha$-$Al_2O_3$ having a particle size not smaller than 0.05 μm and less than 0.5 μm is equal to or more than 10% and equal to or less than 50% and an area $C_2$ in the area $C_1$ occupied by the crystal grains having a normal direction of the (001) plane within ±10° with respect to the normal direction of the processed surface is equal to or more than 50%, and a ratio of a total area of the area $A_1$, the area $B_1$ and the area $C_1$ to an area of the entire color map is equal to or more than 95%.

Advantageous Effects of Invention

According to the above, mechanical characteristics of a coating can be improved and life of a cutting tool can further be longer.

DESCRIPTION OF EMBODIMENTS

Description of Embodiments of Present Invention

Figure 1:
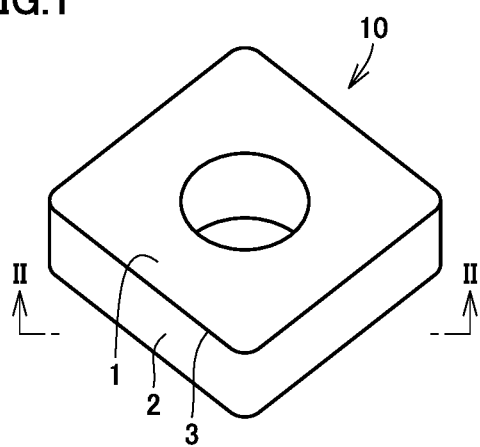
FIG. 1 is a perspective view showing one example of a surface-coated cutting tool according to one embodiment of the present disclosure.

Embodiments of the present invention will initially be listed and described. Regarding crystallographic denotation herein, an individual plane is shown in ( ). Denotation "X to Y" herein means an upper limit and a lower limit of a range (that is, not less than X and not more than Y), and when a unit is specified not for X but only for Y, the unit is common to X and Y. A chemical formula such as "TiN" or "TiCN" in which an atomic ratio is not particularly specified herein does not indicate that an atomic ratio of each element is limited only to "1" but encompasses all conventionally known atomic ratios.

[1] A surface-coated cutting tool according to one embodiment of the present disclosure is a surface-coated cutting tool including a base material and a coating formed on the base material, and the coating has an $\alpha$-$Al_2O_3$ layer containing a plurality of crystal grains of $\alpha$-$Al_2O_3$. When respective crystal orientations of the crystal grains are specified by performing electron beam backscattering diffraction (EBSD) analyses with a field emission-type scanning microscope (FE-SEM) on a processed surface which is in parallel to a surface of the $\alpha$-$Al_2O_3$ layer and is obtained by removing the $\alpha$-$Al_2O_3$ layer located in a region extending from the surface by a length not smaller than 0.1 μm and not greater than 0.5 μm in a depth direction and a 15-μm square color map is prepared based on the crystal orientations, in the color map, an area $A_1$ occupied by crystal grains A of $\alpha$-$Al_2O_3$ having a particle size not smaller than 1 μm and not greater than 3 μm is equal to or less than 50% and an area $A_2$ in the area $A_1$ occupied by the crystal grains having a normal direction of a (001) plane within ±10° with respect to a normal direction of the processed surface is equal to or more than 90%, an area $B_1$ occupied by crystal grains B of $\alpha$-$Al_2O_3$ having a particle size not smaller than 0.5 μm and less than 1 μm is equal to or more than 20% and equal to or less than 50% and an area $B_2$ in the area $B_1$ occupied by the crystal grains having a normal direction of the (001) plane within ±10° with respect to the normal direction of the processed surface is equal to or more than 90%, an area $C_1$ occupied by crystal grains C of $\alpha$-$Al_2O_3$ having a particle size not smaller than 0.05 μm and less than 0.5 μm is equal to or more than 10% and equal to or less than 50% and an area $C_2$ in the area $C_1$ occupied by the crystal grains having a normal direction of the (001) plane within ±10° with respect to the normal direction of the processed surface is equal to or more than 50%, and a ratio of a total area of the area $A_1$, the area $B_1$ and the area $C_1$ to an area of the entire color map is equal to or more than 95%. Such an $\alpha$-$Al_2O_3$ layer can have a high hardness. Therefore, the surface-coated cutting tool according to [1] achieves excellent mechanical characteristics and longer life.

[2] In the surface-coated cutting tool, preferably, the $\alpha$-$Al_2O_3$ layer has a thickness not smaller than 1 μm and not greater than 25 μm. The characteristics above are thus more effectively exhibited.

[3] In the surface-coated cutting tool, preferably, the $\alpha$-$Al_2O_3$ layer has a thickness not smaller than 4 μm and not greater than 15 μm. The characteristics above are thus more effectively exhibited.

[4] In the surface-coated cutting tool, preferably, the coating includes a first intermediate layer between the base material and the $Al_2O_3$ layer, and the first intermediate layer is a TiCN layer. Since the TiCN layer has a high hardness, the surface-coated cutting tool including the coating having such a first intermediate layer is excellent in resistance to wear.

[5] In the surface-coated cutting tool, preferably, the coating includes a second intermediate layer between the base material and the $\alpha$-$Al_2O_3$ layer, the second intermediate layer is a TiCNO layer or a TiBN layer, and a difference between a greatest thickness and a smallest thickness of the second intermediate layer is not smaller than 0.3 μm. Since such a second intermediate layer can exhibit an effect as an anchor achieving intimate contact between the $\alpha$-$Al_2O_3$ layer and the first intermediate layer, resistance to peel-off of the coating can be enhanced. Therefore, the surface-coated cutting tool including the coating having such a second intermediate layer is excellent in resistance to breakage.

[6] In the surface-coated cutting tool, preferably, the coating includes a surface layer located at an outermost surface, and the surface layer is a TiC layer, a TiN layer, or a $TiB_2$ layer. Toughness of the coating is thus improved.

Details of Embodiments of Present Invention

Though one embodiment of the present invention (hereinafter also denoted as the "present embodiment") will be described below, the present embodiment is not limited thereto. "Crystal grains having a normal direction of a (001) plane within ±10° with respect to a normal direction of a surface of the $\alpha$-$Al_2O_3$ layer" are also hereinafter referred to as "(001) plane orientation crystal grains."

[Surface-Coated Cutting Tool]

Referring to FIG. 1, a surface-coated cutting tool 10 according to the present embodiment (hereinafter simply denoted as a "tool 10") has a rake face 1, a flank face 2, and a cutting edge ridgeline portion 3 at which rake face 1 and flank face 2 intersect with each other. Namely, rake face 1 and flank face 2 are surfaces connected to each other with cutting edge ridgeline portion 3 being interposed. Cutting edge ridgeline portion 3 implements a cutting edge tip end portion of tool 10. Such a shape of tool 10 relies on a shape of a base material which will be described later.

Though FIG. 1 shows tool 10 representing a throwaway chip for turning, tool 10 is not limited thereto and the tool can suitably be used as a cutting tool such as a drill, an end mill, a throwaway tip for a drill, a throwaway tip for an end mill, a throwaway tip for milling, a metal saw, a gear cutting tool, a reamer, and a tap.

When tool 10 is implemented as a throwaway chip, tool 10 may or may not have a chip breaker, and cutting edge ridgeline portion 3 may have a sharp edge (a ridge at which a rake face and a flank face intersect with each other), may be honed (a sharp edge provided with R), may have a negative land (beveled), and may be honed and have a negative land.

Figure 2:
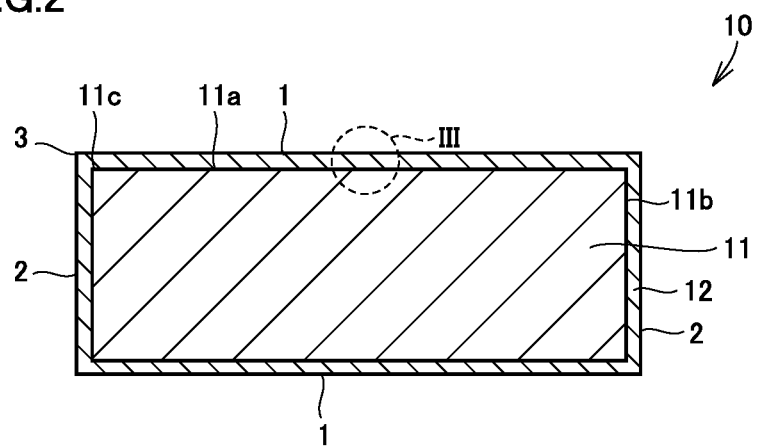
FIG. 2 is a cross-sectional view along the line II-II in FIG. 1.

Referring to FIG. 2, tool 10 has a base material 11 and a coating 12 formed on base material 11. Though coating 12 preferably covers the entire surface of base material 11 in tool 10, a part of base material 11 being not covered with coating 12 or a partially different construction of coating 12 does not depart from the scope of the present embodiment.

[Base Material]

Referring to FIG. 2, base material 11 according to the present embodiment has a rake face 11a, a flank face 11b, and a cutting edge ridgeline portion 11c at which rake face 11a and flank face 11b intersect with each other. Rake face 11a, flank face 11b, and cutting edge ridgeline portion 11c implement rake face 1, flank face 2, and cutting edge ridgeline portion 3 of tool 10, respectively.

For base material 11, any conventionally known base material of such a kind can be employed. Such a base material is preferably exemplified by cemented carbide (for example, WC-based cemented carbide, which contains not only WC but also Co, or to which a carbonitride of Ti, Ta, or Nb may be added), cermet (mainly composed of TiC, TiN, or TiCN), high-speed steel, ceramics (titanium carbide, silicon carbide, silicon nitride, aluminum nitride, or aluminum oxide), a cubic boron nitride sintered object, or a diamond sintered object. Among these various base materials, in particular, WC-based cemented carbide or cermet (in particular, TiCN-based cermet) is preferably selected. This is because such base materials are particularly excellent in balance between hardness and strength at a high temperature and have characteristics excellent as a base material for the surface-coated cutting tool in applications above.

[Coating]

Coating 12 according to the present embodiment includes at least one $\alpha$-$Al_2O_3$ layer which will be described below in detail. Coating 12 can include other layers so long as it includes an $\alpha$-$Al_2O_3$ layer. A composition of other layers is not particularly limited, and examples thereof can include TiC, TiN, TiB, TiBN, TiAlN, TiSiN, AlCrN, TiAlSiN, TiAlNO, AlCrSiCN, TiCN, TiCNO, TiSiC, CrSiN, AlTiSiCO, or TiSiCN. An order of layering is not particularly limited either.

Such coating 12 according to the present embodiment has a function to improve various characteristics such as resistance to wear and resistance to breakage by covering base material 11.

Coating 12 has a thickness preferably from 3 to 35 μm. When coating 12 has a thickness not smaller than 3 μm, shorter life of the tool due to a small thickness of coating 12 can be suppressed. When coating 12 has a thickness not greater than 35 μm, resistance to breakage in an early stage of cutting can be improved.

Coating 12 in which an underlying layer 13, a first intermediate layer 14, a second intermediate layer 15, and an $\alpha$-$Al_2O_3$ layer 16 are successively stacked from a base material side toward a surface side of coating 12 (upward from below in the figure) representing one example of a preferred construction of coating 12 according to the present embodiment will be described with reference to FIG. 3.

[$\alpha$-$Al_2O_3$ Layer]

Alpha-$Al_2O_3$ layer 16 in the present embodiment is a layer containing a plurality of crystal grains of $\alpha$-$Al_2O_3$ (aluminum oxide of which crystal structure is of an $\alpha$ type). Namely, this layer is composed of polycrystalline $\alpha$-$Al_2O_3$. Normally, these crystal grains have a grain size approximately from 0.01 to 3.5 μm.

Alpha-$Al_2O_3$ layer 16 in the present embodiment satisfies (1) to (7) below in a 15-μm square color map created based on respective crystal orientations of crystal grains composed of $\alpha$-$Al_2O_3$, the crystal orientations being specified by performing EBSD analyses with an FE-SEM on a processed surface which is in parallel to a surface of $\alpha$-$Al_2O_3$ layer 16 and is obtained by removing the $\alpha$-$Al_2O_3$ layer located in a region extending from the surface by a length not smaller than 0.1 μm and not greater than 0.5 μm in a depth direction.

(1) An area $A_1$ occupied by crystal grains A of $\alpha$-$Al_2O_3$ having a grain size not smaller than 1 μm and not greater than 3 μm is not higher than 50%.

(2) An area $B_1$ occupied by crystal grains B of $\alpha$-$Al_2O_3$ having a grain size not smaller than 0.5 μm and smaller than 1 μm is not lower than 20% and not higher than 50%.

(3) An area $C_1$ occupied by crystal grains C of $\alpha$-$Al_2O_3$ having a grain size not smaller than 0.05 μm and smaller than 0.5 μm is not lower than 10% and not higher than 50%.

(4) An area $A_2$ in area $A_1$ occupied by (001) plane orientation crystal grains is not lower than 90%.

(5) An area $B_2$ in area $B_1$ occupied by (001) plane orientation crystal grains is not lower than 90%.

(6) An area $C_2$ in area $C_1$ occupied by (001) plane orientation crystal grains is not lower than 50%.

(7) A ratio of a total area of area $A_1$, area $B_1$, and area $C_1$ to an area of the entire color map is not lower than 95%.

A specific method for creating a color map will now be described. Initially, $\alpha$-$Al_2O_3$ layer 16 is formed based on a manufacturing method which will be described later. Then, a processed surface is fabricated, which is a surface in parallel to the surface of formed $\alpha$-$Al_2O_3$ layer 16 (a surface opposite to a surface located on the base material side, which forms the surface of coating 12 in the present embodiment) and a new surface obtained by removing $\alpha$-$Al_2O_3$ layer 16 located in a region extending by 0.1 to 0.5 μm from the surface in a direction of depth. Any position of $\alpha$-$Al_2O_3$ layer 16 can be set as a position to be processed, however, a position in the vicinity of the cutting edge ridgeline portion is preferred, as will be described later.

A focused ion beam (FIB) process using focused ion beams represents an example of a suitable method for fabricating a processed surface. Conditions for the FIB process are as follows. A measured surface (processed surface) in parallel to the surface, which is suitable for EBSD analyses with an FE-SEM, is thus obtained.

Acceleration voltage: 30 kV
Ions: gallium (Ga) ions
Area to be processed: 20 μm×20 μm
Depth of process: 0.1 to 0.5 μm (a thickness of removed $\alpha$-$Al_2O_3$ layer 16)
Irradiation angle: 5°
Irradiation time period: 1 hour Though the method of fabricating a processed surface is not limited to the FIB process, at least a method capable of fabricating a measured surface in conformity with a processed surface fabricated through the FIB process is preferred. When another layer such as a surface layer is formed on $\alpha$-$Al_2O_3$ layer 16, for example, preferably, another layer is removed through grinding using a grindstone No. 3000 to thereby expose $\alpha$-$Al_2O_3$ layer 16, and thereafter the FIB process is performed.

Then, the processed surface is observed with an FE-SEM with EBSD (a product name: "SU6600" manufactured by Hitachi High-Technologies Corporation), and the obtained observation image is subjected to EBSD analyses. Though a location of observation is not particularly limited, a portion in the vicinity of the cutting edge ridgeline portion is preferably observed in consideration of relation with cutting characteristics.

Data in EBSD analyses is successively collected by individually positioning focused electron beams onto each pixel. A normal line to a sample surface (the processed surface of the $\alpha$-$Al_2O_3$ layer subjected to the FIB process) is inclined by 70° with respect to incident beams, and analysis is conducted at 15 kV. In order to avoid a charging effect, a pressure of 10 Pa is applied. A high current mode is set in conformity with a diameter of an opening of 60 μm or 120 μm. Data is collected stepwise at 0.1 μm/step, for 500×300 points corresponding to a plane region of 50×30 μm on a cross-section.

Results of EBSD analyses are analyzed by using commercially available software (a trademark: "orientation Imaging microscopy Ver 6.2" manufactured by EDAX Inc.) and a color map is created. Specifically, an angle formed between the direction of normal to the (001) plane of each measured pixel and a direction of normal to the surface of $\alpha$-$Al_2O_3$ layer 16 (the surface located on the surface side of the coating) (that is, a direction of normal to the processed surface of the $\alpha$-$Al_2O_3$ layer fabricated through the FIB process) is calculated with the software, and a color map in which a color is varied for each angle is created. The technique according to "Crystal Direction MAP" included in the software can be used for creating a color map.

Crystal grains A, crystal grains B, and crystal grains C can be distinguished from one another by categorizing crystal grains for each grain size with the use of the color map. Specifically, initially, a region in the color map where a color is consistent (that is, a plane orientation is consistent) and surrounded by other colors (that is, other plane orientations) is regarded as an individual region of each crystal grain. Then, a longest virtual diagonal of each crystal grain is drawn, which is defined as a grain size of each crystal grain. Then, distinction is made such that crystal grains having a grain size not smaller than 1 μm and not greater than 3 μm are defined as coarse crystal grains A, crystal grains having a grain size not smaller than 0.5 μm and smaller than 1 μm are defined as medium-sized crystal grains B, and crystal grains having a grain size not smaller than 0.05 μm and smaller than 0.5 μm are defined as fine crystal grains C.

An area occupied by each type of crystal grains and an area occupied by (001) plane orientation crystal grains in the area occupied by each type of crystal grains in the color map can be found based on crystal grains A, crystal grains B, and crystal grains C which are distinguished from one another. The color map of a 15-μm square (15 μm×15 μm) processed surface is created.

Figure 4:
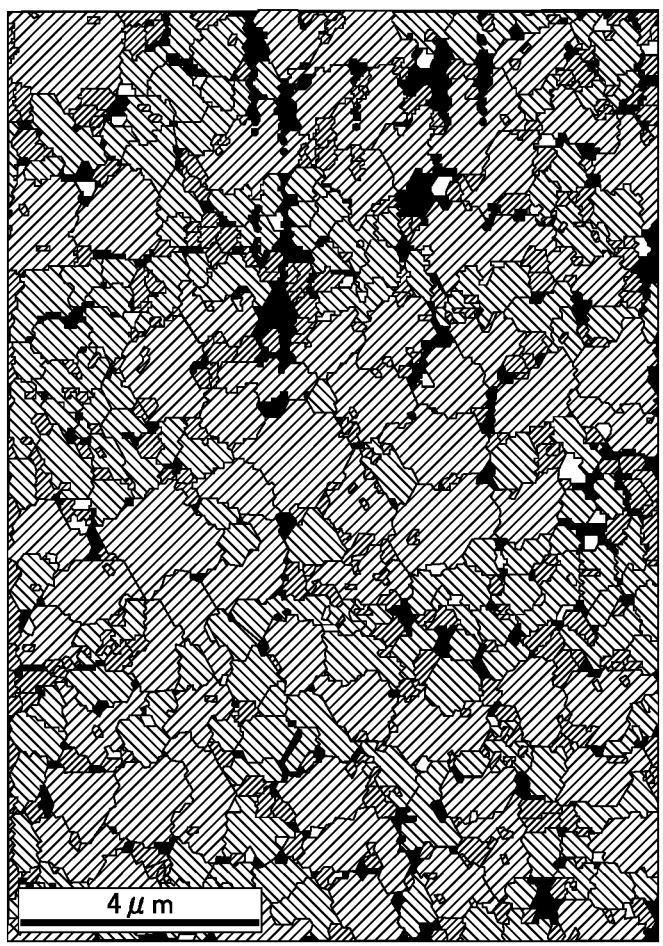
FIG. 4 shows one example of a color map of a processed surface of an $\alpha$-$Al_2O_3$ layer.

FIG. 4 shows one example of the color map of the above-described processed surface of α-$Al_2O_3$ layer 16. In FIG. 4, a hatched region surrounded by a solid line represents the (001) plane orientation crystal grains, and each hollow region surrounded by a solid line represents crystal grains other than the (001) plane orientation crystal grains. Namely, in the color map illustrated in FIG. 4, crystal grains of which angle of the direction of normal to the (001) plane with respect to the direction of normal to the surface of α-$Al_2O_3$ layer 16 is not greater than 10° are shown as being hatched, and crystal grains of which angle of the direction of normal to the (001) plane with respect to the direction of normal to the surface of α-$Al_2O_3$ layer 16 exceeds 10° are shown as being hollow. In FIG. 4, a region of which crystal orientation has not been specified is shown in black.

Figure 5:
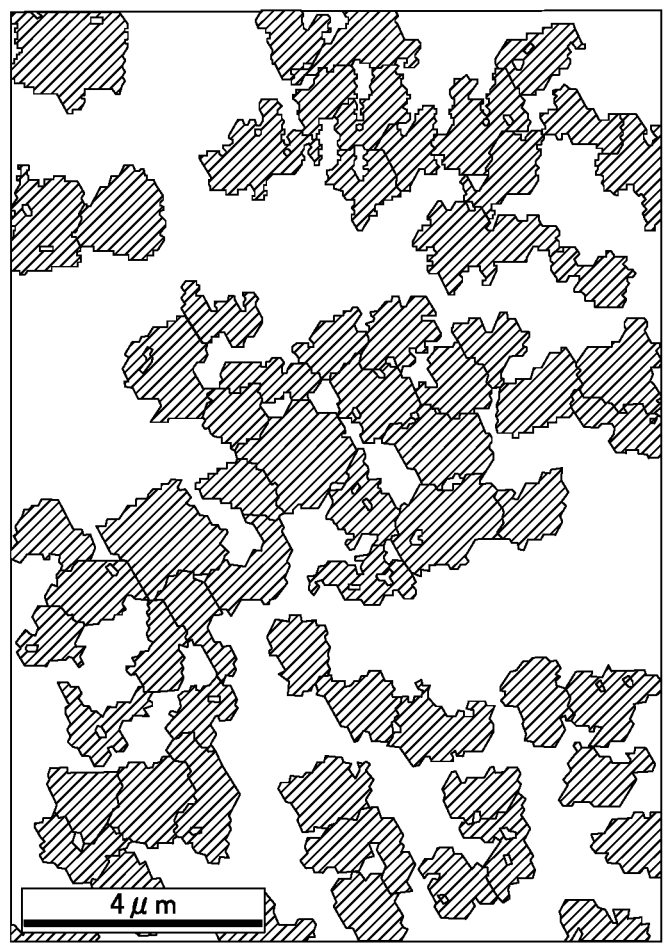
FIG. 5 shows a color map showing only coarse grains of crystal grains shown in the color map in FIG. 4.
Figure 6:
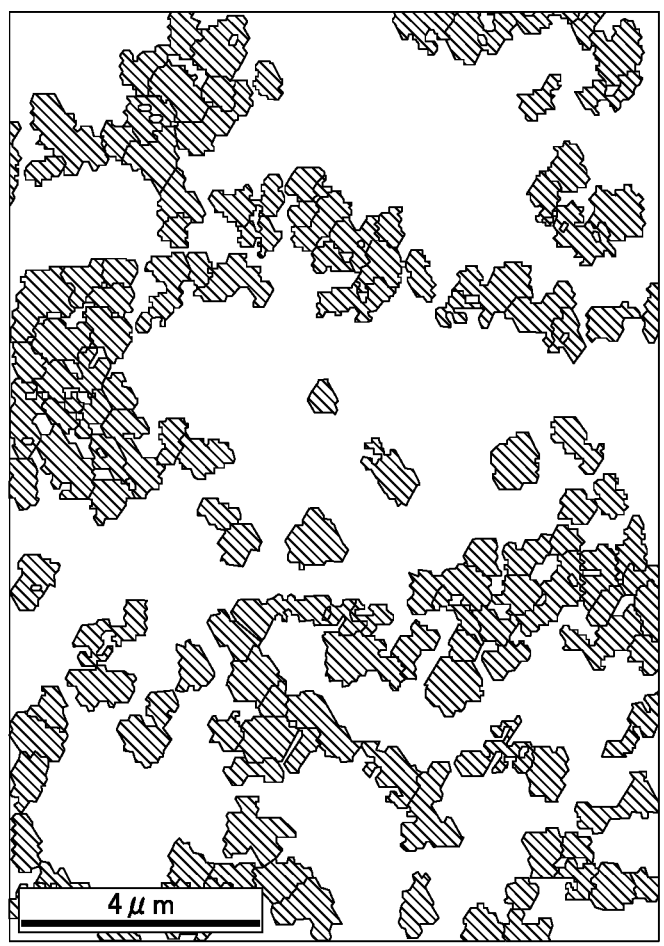
FIG. 6 shows a color map showing only medium-sized grains of the crystal grains shown in the color map in FIG. 4.
Figure 7:
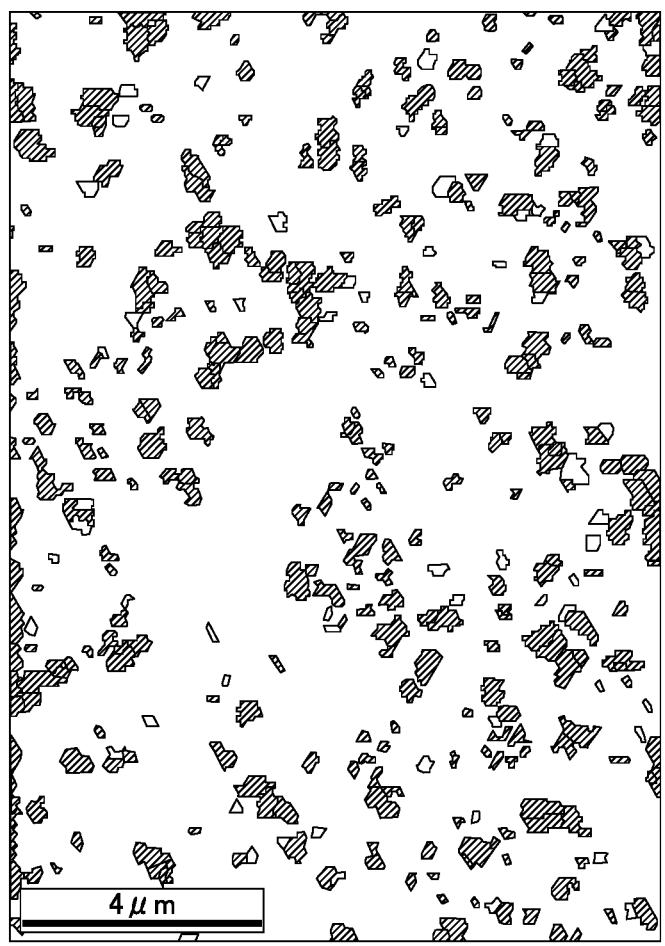
FIG. 7 shows a color map showing only fine grains of the crystal grains shown in the color map in FIG. 4.

FIGS. 5 to 7 illustrate color maps in which crystal grains A (coarse grains), crystal grains B (medium-sized grains), and crystal grains C (fine grains) are identified in the color map in FIG. 4. Namely, the color map in FIG. 5 shows only crystal grains A of crystal grains shown in the color map in FIG. 4. The color map in FIG. 6 shows only crystal grains B of the crystal grains shown in the color map in FIG. 4. The color map in FIG. 7 shows only crystal grains C of the crystal grains shown in FIG. 4. In particular, in FIG. 7, a hatched region surrounded by a solid line represents (001) plane orientation crystal grains of crystal grains C, and a region surrounded by a solid line but not hatched represents crystal grains other than the (001) plane orientation crystal grains of crystal grains C. It can be seen with reference to FIGS. 5 and 6 that, in α-$Al_2O_3$ layer 16 exhibiting this color map, all crystal grains A are the (001) plane orientation crystal grains and all crystal grains B are the (001) plane orientation crystal grains.

Tool 10 including α-$Al_2O_3$ layer 16 satisfying (1) to (7) is better in mechanical characteristics and longer in life than a conventional tool.

Specifically, the α-$Al_2O_3$ layer satisfying (1) to (3) and (7) is lower in ratio of coarse grains than that in a conventional example. Though coarse grains are more likely to fall off from the α-$Al_2O_3$ layer than fine grains or medium-sized grains, α-$Al_2O_3$ layer 16 according to the present embodiment achieves suppression of such fall-off as compared with the conventional example, and it is high in resistance to breakage. The α-$Al_2O_3$ layer satisfying (4) to (6) is higher in ratio occupied by the (001) plane orientation crystal grains for each of the coarse grains, the medium-sized grains, and the fine grains than the conventional example. Therefore, α-$Al_2O_3$ layer 16 according to the present embodiment is excellent in resistance to wear. Therefore, since α-$Al_2O_3$ layer 16 according to the present embodiment is excellent in both characteristics of resistance to wear and resistance to breakage, tool 10 including coating 12 having α-$Al_2O_3$ layer 16 achieves improved mechanical characteristics as compared with the conventional example and is longer in life.

In connection with (1), when a ratio of area $A_1$ exceeds 50%, resistance to wear of α-$Al_2O_3$ layer 16 significantly lowers. The ratio of area $A_1$ is preferably not higher than 49%. Though a lower limit value of the ratio of area $A_1$ is not particularly restricted, from a point of view of resistance to breakage, it is preferably not lower than 10% and more preferably not lower than 25%.

In connection with (2), when a ratio of area $B_1$ exceeds 50%, lowering in resistance to wear is concerned. When the ratio of area $B_1$ is lower than 20%, lowering in resistance to breakage is concerned. The ratio of area $B_1$ is preferably from 25 to 48%.

In connection with (3), when a ratio of area $C_1$ exceeds 50%, lowering in resistance to breakage due to excessive increase in ratio of fine grains is concerned.

When the ratio of area $C_1$ is lower than 10%, lowering in resistance to wear is concerned. The ratio of area $C_1$ is preferably from 15 to 40% and more preferably from 15 to 37%.

In connection with (4), when a ratio of area $A_2$ is lower than 90%, a hardness of α-$Al_2O_3$ layer 16 significantly lowers, which results in lowering in resistance to wear. The ratio of area $A_2$ is preferably not lower than 92%. An upper limit of the ratio of area $A_2$ is not particularly limited, and it can be set to 100%.

In connection with (5), when a ratio of area $B_2$ is lower than 90%, a hardness of α-$Al_2O_3$ layer 16 significantly lowers, which results in lowering in resistance to wear. The ratio of area $B_2$ is preferably not lower than 92%. An upper limit of the ratio of area $B_2$ is not particularly limited, and it can be set to 100%.

In connection with (6), when a ratio of area $C_2$ is lower than 50%, a hardness of α-$Al_2O_3$ layer 16 significantly lowers, which results in lowering in resistance to wear. The ratio of area $C_2$ is preferably not lower than 52%. An upper limit of the ratio of area $C_2$ is not particularly limited, and it can be set to 100%. Though it has been particularly difficult to increase a ratio of area $C_2$, it should be noted that a manufacturing method which will be described later allows such increase.

In connection with (7), when a ratio of the total area of area $A_1$, area $B_1$, and area $C_1$ to the area of the entire color map is lower than 95%, in the processed surface, particularly coarse crystal grains having a grain size exceeding 3 μm or particularly fine crystal grains having a grain size smaller than 0.05 μm are present or a portion in which crystal grains are missing is present. Such α-$Al_2O_3$ layer 16 is significantly low in resistance to wear and resistance to breakage.

[Thickness of α-$Al_2O_3$ Layer]

Alpha-$Al_2O_3$ layer 16 in the present embodiment has a thickness preferably from 3 to 25 μm. The excellent effect as above can thus be exhibited. The thickness is more preferably from 4 to 15 μm and further preferably from 5 to 15 μm.

When α-$Al_2O_3$ layer 16 has a thickness smaller than 3 μm, an extent of improvement in resistance to wear owing to presence of α-$Al_2O_3$ layer 16 tends to be low. When the thickness exceeds 25 μm, interface stress attributed to a difference in coefficient of linear expansion between α-$Al_2O_3$ layer 16 and another layer increases and crystal grains of α-$Al_2O_3$ may come off. Such a thickness can be determined by observing a vertical cross-section of base material 11 and coating 12 with a scanning electron microscope (SEM).

[First Intermediate Layer]

Referring back to FIG. 3, coating 12 according to the present embodiment has a TiCN layer as first intermediate layer 14 between base material 11 and $\alpha$-$Al_2O_3$ layer 16. Since the TiCN layer is excellent in resistance to wear, resistance to wear of coating 12 can thus further be improved.

[Second Intermediate Layer]

Figure 3:
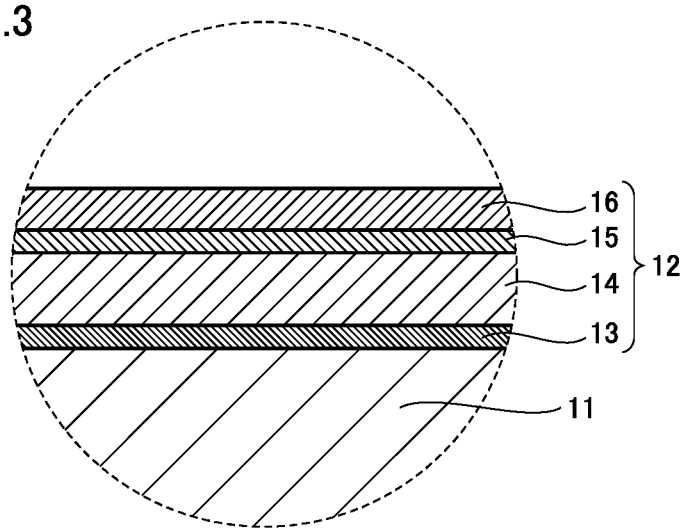
FIG. 3 is a partially enlarged view of FIG. 2.
Figure 8:
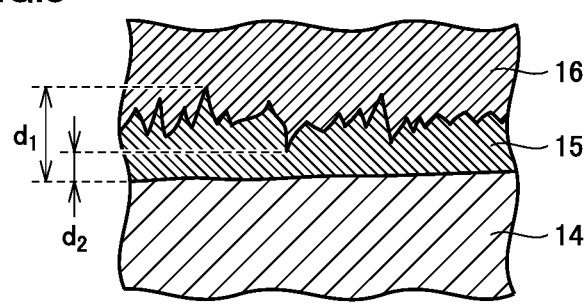
FIG. 8 is a cross-sectional view schematically showing a shape of a second intermediate layer in a direction of thickness.

Referring to FIG. 3, coating 12 according to the present embodiment has second intermediate layer 15 between first intermediate layer 14 and $\alpha$-$Al_2O_3$ layer 16. As shown in FIG. 8, second intermediate layer 15 is preferably formed of needle crystals. The needle crystals refer to crystals having an elongated shape like a needle because its direction of crystal growth extends in one direction. A layer formed of needle crystals is characterized by a significantly varied thickness thereof and a complicated surface shape as shown in FIG. 8, and hence it can exhibit an effect as an anchor to a layer with which it is in contact. Therefore, with second intermediate layer 15 between base material 11 and $\alpha$-$Al_2O_3$ layer 16, $\alpha$-$Al_2O_3$ layer 16 is less likely to peel off from base material 11 and hence resistance to breakage of tool 10 including coating 12 is further enhanced.

Second intermediate layer 15 is preferably formed from a TiCNO layer or a TiBN layer because TiCNO and TiBN are more likely to form needle crystals. A difference between greatest thickness $d_1$ and smallest thickness $d_2$ of second intermediate layer 15 is preferably not smaller than 0.3 µm. In this case, the characteristics above are effectively exhibited. The difference is preferably not greater than 1.0 µm. When the difference exceeds 1.0 µm, a shape of second intermediate layer 15 may adversely affect a shape of coating 12. The difference can be determined with an FE-SEM with EBSD.

[Underlying Layer]

Referring to FIG. 3, coating 12 according to the present embodiment has underlying layer 13 in contact with base material 11. Adhesion between base material 11 and coating 12 can further be enhanced by employing, for example, a TiN layer as underlying layer 13.

[Other Layers]

Coating 12 according to the present embodiment may have a surface layer on $\alpha$-$Al_2O_3$ layer 16. The surface layer may be formed from a TiC layer, a TiN layer, or a $TiB_2$ layer. Though $\alpha$-$Al_2O_3$ layer 16 is highly oriented in line with the (001) plane, the TiC layer, the TiN layer, and the $TiB_2$ layer formed on $\alpha$-$Al_2O_3$ layer 16 are particularly effective in suppression of propagation of a crack during intermittent cutting. Therefore, coating 12 having a surface layer of such a composition is advantageous in improvement in toughness. Among these, the TiN layer exhibits a clear gold color, and therefore identification of a cutting edge after use for cutting is easy, which is advantageous in terms of cost efficiency.

[Manufacturing Method]

Tool 10 according to the present embodiment described above can be manufactured by fabricating coating 12 on a surface of base material 11. Coating 12 can be formed with chemical vapor deposition (CVD) with the use of a CVD apparatus illustrated in FIG. 9.

Figure 9:
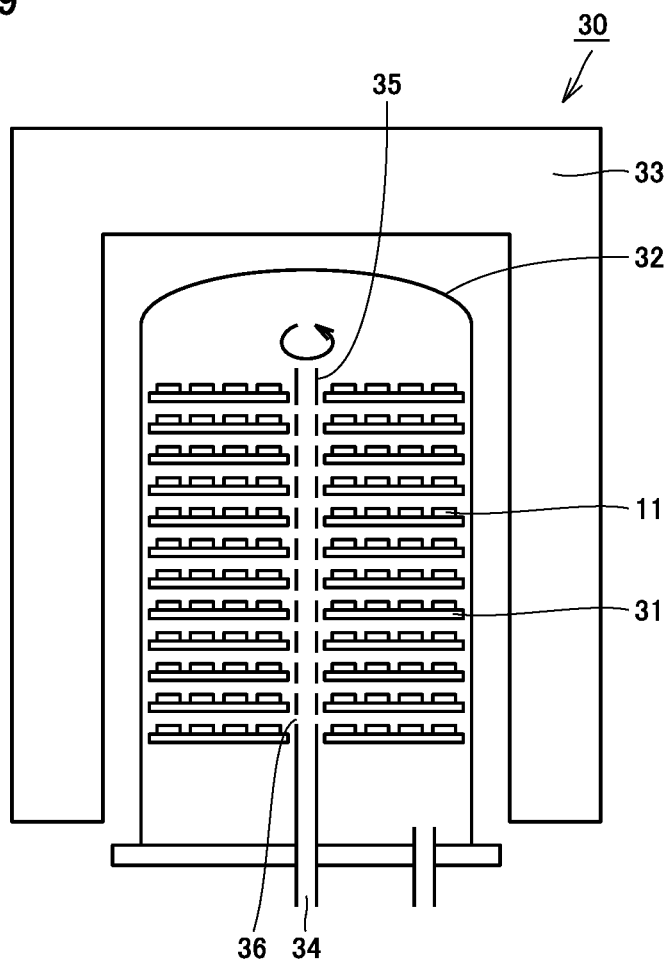
FIG. 9 is a cross-sectional view schematically showing one example of a chemical vapor deposition apparatus used for manufacturing a coating according to an embodiment.

Referring to FIG. 9, a CVD apparatus 30 includes a plurality of base material setting jigs 31 for holding base materials 11 and a reaction vessel 32 made of heat resistant alloy steel, which covers base material setting jigs 31. A thermostat 33 for controlling a temperature in reaction vessel 32 is provided around reaction vessel 32. A gas introduction pipe 35 having a gas inlet port 34 is provided in reaction vessel 32. Gas introduction pipe 35 is arranged to extend in a vertical direction in an internal space in reaction vessel 32 where base material setting jigs 31 are arranged, and provided with a plurality of injection holes 36 for injecting a gas into reaction vessel 32. Each layer can be formed as follows, with the use of this CVD apparatus 30.

Initially, base material 11 is arranged on base material setting jig 31, and a source gas for underlying layer 13 is introduced from gas introduction pipe 35 into reaction vessel 32 while a temperature and a pressure in reaction vessel 32 are controlled within a prescribed range. Underlying layer 13 is thus fabricated on the surface of base material 11. Similarly, first intermediate layer 14 and second intermediate layer 15 are successively formed on underlying layer 13 by successively introducing a source gas for first intermediate layer 14 and a source gas for second intermediate layer 15 into reaction vessel 32.

For example, in manufacturing a TiN layer, $TiCl_4$ and $N_2$ can be employed as source gases. In manufacturing a TiCN layer, $TiCl_4$, $N_2$, and $CH_3CN$ can be employed. In manufacturing a TiCNO layer, $TiCl_4$, $N_2$, CO, and $CH_4$ can be employed.

A temperature in reaction vessel 32 in forming each layer is preferably controlled to 1000 to 1100° C., and a pressure in reaction vessel 32 is preferably controlled to 0.1 to 1013 hPa. HCl may be introduced together with a source gas. With introduction of HCl, uniformity in thickness of the layers can be improved. $H_2$ is preferably employed as a carrier gas. During introduction of gases, gas introduction pipe 35 is preferably rotated by a not-shown drive portion. Each gas can thus uniformly be distributed in reaction vessel 32.

At least one of the layers may be formed with medium temperature (MT)-CVD. Unlike CVD performed at a temperature from 1000° C. to 1100° C. (hereinafter also referred to as "HT-CVD"), MT-CVD is a method of forming a layer with a temperature in reaction vessel 32 being maintained at a relatively mild temperature from 850 to 950° C. Since MT-CVD is performed at a temperature relatively lower than that in HT-CVD, damage to base material 11 by heating can be lessened. In particular, a TiCN layer is preferably formed with MT-CVD.

Then, $\alpha$-$Al_2O_3$ layer 16 is formed on second intermediate layer 15. Alpha-$Al_2O_3$ layer 16 according to the present embodiment can be formed with CVD including a first step and a second step below. Each step will sequentially be described below.

Firstly, a first $\alpha$-$Al_2O_3$ layer is formed on second intermediate layer 15 (the first step). $AlCl_3$, $N_2$, $CO_2$, and $H_2S$ are employed as source gases. Here, a ratio between flow rates as satisfying $CO_2/H_2S \geq 2$ is set for flow rates (l/min.) of $CO_2$ and $H_2S$. The first $\alpha$-$Al_2O_3$ layer is thus formed. Though an upper limit value for $CO_2/H_2S$ is not particularly restricted, the upper limit value not greater than 5 is preferred from a point of view of uniformity in thickness of the layer. The present inventors have confirmed that flow rates of $CO_2$ and $H_2S$ in the first step are preferably set to 0.4 to 2.0 l/min. and 0.1 to 0.8 l/min. and most preferably to 1 l/min. and 0.5 l/min., respectively.

Secondly, a second $\alpha$-$Al_2O_3$ layer is formed on the first $\alpha$-$Al_2O_3$ layer (the second step). $AlCl_3$, $N_2$, $CO_2$, and $H_2S$ are employed as source gases. Here, a ratio between flow rates as satisfying $0.5 \leq CO_2/H_2S \leq 1$ is set for flow rates (l/min.) of a $CO_2$ gas and an $H_2S$ gas.

In the first step and the second step, a temperature in reaction vessel 32 is controlled preferably to 1000 to 1100° C. and a pressure in reaction vessel 32 is controlled preferably to 0.1 to 100 hPa. HCl may be introduced together with the source gases listed above and $H_2$ can be employed as a carrier gas. During introduction of gases, gas introduction pipe 35 is preferably rotated, which is similarly preferable as above.

Alpha-$Al_2O_3$ layer 16 constituted of the first $\alpha$-$Al_2O_3$ layer and the second $\alpha$-$Al_2O_3$ layer and formed through the first step and the second step may be subjected to blast treatment from the surface side. Though a layer formed with CVD tends to generally have tensile residual stress, compressive residual stress can be provided to the surface side of $\alpha$-$Al_2O_3$ layer 16 in the present step so that a hardness of $\alpha$-$Al_2O_3$ layer 16 can be enhanced.

When coating 12 has a surface layer formed on $\alpha$-$Al_2O_3$ layer 16, blast treatment is preferably performed after the surface layer is formed, because, in order to form a surface layer after blast treatment, CVD apparatus 30 should be turned off and base material 11 should be taken out of reaction vessel 32, which makes a manufacturing process complicated. Since this surface layer should only remain on a part of the surface of tool 10, the surface layer may partially be removed in blast treatment.

With the manufacturing method described above, coating 12 can be manufactured and hence tool 10 including coating 12 can be manufactured. Though a reason why $\alpha$-$Al_2O_3$ layer 16 satisfying (1) to (7) is formed with such a manufacturing method is unclear, the present inventors estimate as follows.

In forming an $\alpha$-$Al_2O_3$ layer on a layer different in composition from the $\alpha$-$Al_2O_3$ layer (in the present embodiment, second intermediate layer 15), it tends to be difficult to align orientations of crystal grains of $\alpha$-$Al_2O_3$. This is because compatibility with a layer different in composition from $\alpha$-$Al_2O_3$ affects an orientation of crystal grains of $\alpha$-$Al_2O_3$. Therefore, if formation of an $\alpha$-$Al_2O_3$ layer on second intermediate layer 15 proceeds while there are few (001) plane orientation crystal grains, an $\alpha$-$Al_2O_3$ layer in which there are few (001) plane orientation crystal grains will be formed.

In contrast, even though there are few (001) plane orientation crystal grains in the first $\alpha$-$Al_2O_3$ layer formed in the first step, by performing the first step and the second step as described above, formation of an $\alpha$-$Al_2O_3$ layer will not proceed as it is as in the conventional example (that is, switching to the second step is made). Therefore, formation of an $\alpha$-$Al_2O_3$ layer in which there are few (001) plane orientation crystal grains as above can be prevented. In particular, as the first $\alpha$-$Al_2O_3$ layer is formed on another layer in the first step, the second $\alpha$-$Al_2O_3$ layer formed in the subsequent second step is not affected by compatibility as described above, and it is rather formed on the first $\alpha$-$Al_2O_3$ layer with which the second $\alpha$-$Al_2O_3$ layer is more compatible (more adaptable). Therefore, consequently, the second $\alpha$-$Al_2O_3$ layer has excellent (001) orientation.

By controlling each condition for CVD in the manufacturing method, a property of each layer varies. For example, a composition of each layer is determined by a composition of a source gas introduced in reaction vessel 32, and a thickness of each layer is controlled by a duration of a process (a duration of film formation). Second intermediate layer 15 is preferably made of needle crystals, and a shape of a crystal can be like a needle by controlling a flow rate of a source gas and a temperature for film formation. Lengths of needle crystals can be made non-uniform by controlling a pressure during formation, so that a difference between greatest thickness $d_1$ and smallest thickness $d_2$ as described above can be produced. In particular, in order to lower a ratio of coarse grains or to enhance the (001) plane orientation in $\alpha$-$Al_2O_3$ layer 16, control of a ratio of a flow rate ($CO_2/H_2S$) between a $CO_2$ gas and an $H_2S$ gas of the source gases is important.

EXAMPLES

Though the present invention will be described in further detail below with reference to Examples, the present invention is not limited thereto. Samples Nos. 1 to 12 correspond to Examples and samples Nos. 13 to 17 represent Comparative Examples.

[Fabrication of Sample]

Fabrication of sample No. 1 will initially be described. A chip made of cemented carbide (shape: CNMG120408N-UX manufactured by Sumitomo Electric Hardmetal Corporation, JIS B4120 (2013)) composed of TaC (2.0 mass %), NbC (1.0 mass %), Co (10.0 mass %), and WC (remainder) (and containing an inevitable impurity) was prepared as a base material. A coating was fabricated on the surface of the base material by successively forming an underlying layer, a first intermediate layer, a second intermediate layer, an $\alpha$-$Al_2O_3$ layer, and a surface layer on the prepared base material with the use of a CVD apparatus. Conditions for forming each layer are shown below. A flow rate (l/min.) of each gas is shown in parentheses following a composition of each gas.

(Underlying Layer: TiN Layer)
Gas: $TiCl_4$ (5), $N_2$ (15), $H_2$ (45)
Pressure and Temperature: 130 hPa and 900° C.
(First Intermediate Layer: TiCN Layer)
Gas: $TiCl_4$ (10), $N_2$ (15), $CH_3CN$ (1.0), $H_2$ (80)
Pressure and Temperature: 90 hPa and 860° C. (MT-CVD)
(Second Intermediate Layer: TiCNO Layer)
Gas: $TiCl_4$ (0.002), $CH_4$ (2.5), $N_2$ (6.0), CO (0.5), HCl (1.2), $H_2$ (40)
Pressure and Temperature: 180 hPa and 1010° C.
($\alpha$-$Al_2O_3$ Layer)
(1) Conditions for CVD in First Step
Gas: $AlCl_3$ (2.5), $CO_2$ (1.3), $H_2S$ (0.4), $H_2$ (40)
Pressure and Temperature: 80 hPa and 1000° C.
(2) Conditions for CVD in Second Step
Gas: $AlCl_3$ (3.0), $CO_2$ (1.2), $H_2S$ (1.4), $H_2$ (32)
Pressure and Temperature: 80 hPa and 1000° C.
(Surface Layer: TiN Layer)
Gas: $TiCl_4$ (5), $N_2$ (15), $H_2$ (45)
Pressure and Temperature: 130 hPa and 900° C.

Then, a throwaway chip for turning representing a base material having a coating formed was subjected to blast treatment below. Balls made of aluminum oxide having an average particle size of 50 μm were caused to collide evenly with a rake face and a flank face for 5 seconds with compressed air at 0.1 MPa in a direction at 45° with respect to the cutting edge ridgeline portion while the chip was rotated at 100 rpm.

A tool according to sample No. 1 was fabricated as above. Each tool according to each of samples Nos. 2 to 17 was also fabricated by forming a coating constituted of an underlying layer, a first intermediate layer, a second intermediate layer, an $\alpha$-$Al_2O_3$ layer, and a surface layer on the similar base material. In each sample, a composition of the second intermediate layer and the surface layer was varied as appropriate by varying a source gas used for forming the second intermediate layer and the surface layer. Table 1 shows a composition and a thickness of each layer forming the coating in each sample. A thickness of each layer was adjusted by adjusting as appropriate a duration of film formation.

TABLE 1

| | Composition/Thickness (μm) | | | | |
|---|---|---|---|---|---|
| | Under-lying Layer | First Intermediate Layer | Second Intermediate Layer | $\alpha$-$Al_2O_3$ Layer | Surface Layer |
| No. 1 | 0.3 | 5 | TiCNO/0.5 | 5 | TiN/0.7 |
| No. 2 | 0.3 | 5.5 | TiBN/0.5 | 13 | $TiB_2$/0.5 |
| No. 3 | 0.3 | 8.2 | TiCN/0.8 | 7.5 | TiC/0.3 |
| No. 4 | 0.3 | 4.8 | TiBN/0.3 | 3.5 | TiN/0.5 |
| No. 5 | 0.3 | 5.4 | TiCNO/0.5 | 17 | TiC/0.4 |
| No. 6 | 0.3 | 6.5 | TiBN/0.8 | 22 | TiN/0.5 |
| No. 7 | 0.3 | 7.5 | TiCNO/0.8 | 5.2 | — |
| No. 8 | 0.3 | 5.5 | TiCNO/0.5 | 8.5 | — |
| No. 9 | 0.3 | 4.5 | TiCNO/1.2 | 4.8 | TiC/0.8 |
| No. 10 | 0.3 | 9.3 | TiBN/2.5 | 9.2 | $TiB_2$/0.5 |
| No. 11 | 0.3 | 5.7 | TiCNO/1.2 | 11.5 | TiC/0.5 |
| No. 12 | 0.3 | 8.2 | TiCNO/1.5 | 5.2 | $TiB_2$/0.5 |
| No. 13 | 0.4 | 6.5 | TiCNO/0.5 | 4 | TiN/0.5 |
| No. 14 | 0.4 | 5.5 | TiBN/0.3 | 3 | $TiB_2$/0.5 |
| No. 15 | 0.4 | 7.3 | TiCNO/0.5 | 3 | — |
| No. 16 | 0.4 | 8.8 | TiBN/0.3 | 4.5 | TiN/0.3 |
| No. 17 | 0.4 | 5.5 | TiCNO/0.8 | 8.5 | TiC/0.3 |

For the second intermediate layer and the $\alpha$-$Al_2O_3$ layer, conditions other than the source gas and the duration of film formation were also varied as appropriate. Specifically, a pressure during film formation was varied for the second intermediate layer as shown in Table 2. Thus, a difference between a greatest thickness and a smallest thickness of the second intermediate layer formed of needle crystals in each sample was different as shown in Table 2.

TABLE 2

| | Second Intermediate Layer | |
|---|---|---|
| | Pressure During Film Formation (hPa) | Difference Between Greatest Thickness and Smallest Thickness (μm) |
| No. 1 | 180 | 0.4 |
| No. 2 | 180 | 0.5 |
| No. 3 | 210 | 0.8 |
| No. 4 | 180 | 0.5 |
| No. 5 | 180 | 0.5 |
| No. 6 | 180 | 0.5 |
| No. 7 | 180 | 0.5 |
| No. 8 | 210 | 0.8 |
| No. 9 | 130 | 0.2 |
| No. 10 | 250 | 1.3 |
| No. 11 | 130 | 0.2 |
| No. 12 | 250 | 1.3 |
| No. 13 | 80 | 0.1 |
| No. 14 | 150 | 0.3 |
| No. 15 | 80 | 0.1 |
| No. 16 | 80 | 0.1 |
| No. 17 | 150 | 0.3 |

For the $\alpha$-$Al_2O_3$ layer, a ratio of a flow rate ($CO_2$/$H_2S$) between $CO_2$ and $H_2S$ of gases to be introduced was varied as shown in Table 3. For samples Nos. 1 to 12, a gas for the first step was introduced for 30 minutes and thereafter a gas for the second step was introduced. For samples Nos. 13 to 17, the first step was not performed and only the second step was performed.

Then, the $\alpha$-$Al_2O_3$ layer located in a region extending by 0.2 μm from the surface of the $\alpha$-$Al_2O_3$ layer in a direction of depth was removed by performing the FIB process described above in the vicinity of the cutting edge ridgeline portion on a side of the rake face of the tool provided with the coating on the surface of the base material. A processed surface was thus fabricated. A color map described above of the processed surface having a size of 15 μm×15 μm was created by observing the fabricated processed surface with an FE-SEM with EBSD. Then, with each color map, respective areas $A_1$, $B_1$, and $C_1$ occupied by crystal grains A, crystal grains B, and crystal grains C and ratios $A_2$, $B_2$, and $C_2$ of areas of the (001) plane orientation crystal grains occupied in the respective areas were found. Table 3 shows results. As is clear in Table 3, in each color map, a ratio of the total area of area $A_1$, area $B_1$, and area $C_1$ to the area of the entire color map was 100%.

TABLE 3

| | CVD Condition Ratio of Flow Rate ($CO_2$/$H_2S$) | | Coarse Grains (Crystal Grains A) | | Medium-Sized Grains (Crystal Grains B) | | Fine Grains (Crystal Grains C) | |
|---|---|---|---|---|---|---|---|---|
| $\alpha$-$Al_2O_3$ Layer | First Step | Second Step | Area $A_1$ | Area $A_2$ | Area $B_1$ | Area $B_2$ | Area $C_1$ | Area $C_2$ |
| No. 1 | 3.3 | 0.9 | 49 | 100 | 36 | 100 | 15 | 90 |
| No. 2 | 4.0 | 0.8 | 35 | 96 | 47 | 100 | 18 | 78 |
| No. 3 | 2.5 | 0.9 | 42 | 92 | 25 | 92 | 33 | 64 |
| No. 4 | 3.3 | 0.6 | 25 | 94 | 48 | 92 | 27 | 52 |
| No. 5 | 4.5 | 0.6 | 43 | 98 | 32 | 95 | 25 | 60 |
| No. 6 | 3.3 | 0.9 | 38 | 100 | 45 | 100 | 17 | 95 |
| No. 7 | 2.5 | 0.8 | 38 | 100 | 25 | 98 | 37 | 72 |
| No. 8 | 2.2 | 0.8 | 40 | 95 | 45 | 94 | 15 | 69 |
| No. 9 | 3.8 | 0.9 | 38 | 92 | 26 | 92 | 36 | 70 |
| No. 10 | 4.5 | 0.9 | 36 | 95 | 47 | 98 | 17 | 62 |
| No. 11 | 4.8 | 0.6 | 45 | 100 | 38 | 94 | 17 | 75 |
| No. 12 | 3.3 | 0.6 | 38 | 94 | 38 | 94 | 24 | 92 |
| No. 13 | — | 0.6 | 45 | 65 | 45 | 40 | 10 | 48 |
| No. 14 | — | 0.7 | 63 | 25 | 25 | 20 | 12 | 18 |
| No. 15 | — | 0.7 | 30 | 0 | 65 | 0 | 5 | 0 |

TABLE 3-continued

| α-Al$_2$O$_3$ Layer | CVD Condition Ratio of Flow Rate (CO$_2$/H$_2$S) | | Coarse Grains (Crystal Grains A) | | Medium-Sized Grains (Crystal Grains B) | | Fine Grains (Crystal Grains C) | |
|---|---|---|---|---|---|---|---|---|
| | First Step | Second Step | Area A$_1$ | Area A$_2$ | Area B$_1$ | Area B$_2$ | Area C$_1$ | Area C$_2$ |
| No. 16 | — | 0.9 | 60 | 0 | 35 | 0 | 5 | 15 |
| No. 17 | — | 0.6 | 48 | 25 | 32 | 12 | 20 | 20 |

[Evaluation 1: Resistance to Breakage]

A chip according to each sample was set on a cutting tool of a model number PCLNR2525-43 (manufactured by Sumitomo Electric Industries, Ltd.) and resistance to breakage thereof in repeated turning of alloy steel was evaluated.

Conditions for cutting are as follows. Twenty chips for each sample were used for turning for 20 seconds, and a ratio (number) of chips which have failed among 20 chips in total was calculated as a ratio of failure (%). Table 4 shows results. A lower ratio of failure (%) in Table 4 indicates better resistance to breakage.

Work material: SCM440 (with 6 grooves, φ 350 mm)
Cutting speed: 120 m/min.
Depth of cutting: 2.0 mm
Coolant: not used

[Evaluation 2: Resistance to Wear]

A chip according to each sample was set on a cutting tool of a model number PCLNR2525-43 (manufactured by Sumitomo Electric Industries, Ltd.) and resistance to wear thereof in repeated turning of alloy steel was evaluated.

Conditions for turning are as follows. Twenty chips for each sample were used for turning for 15 minutes. An amount of wear Vb (mm) on a side of a flank face of 20 chips in total was measured and an average value for each sample was calculated. Table 4 shows results. A smaller value of Vb mm) in Table 4 indicates better resistance to wear.

Work material: SCr420H (φ 250 mm)
Cutting speed: 280 m/min.
Depth of cutting: 2.0 mm
Feed rate: 0.2 mm/rev
Coolant: water-soluble oil

TABLE 4

| | Evaluation 1 Ratio of Failure (%) | Evaluation 2 Vb (mm) |
|---|---|---|
| No. 1 | 0 | 0.05 |
| No. 2 | 0 | 0.06 |
| No. 3 | 5 | 0.07 |
| No. 4 | 10 | 0.09 |
| No. 5 | 20 | 0.08 |
| No. 6 | 25 | 0.13 |
| No. 7 | 10 | 0.08 |
| No. 8 | 10 | 0.09 |
| No. 9 | 10 | 0.10 |
| No. 10 | 15 | 0.09 |
| No. 11 | 25 | 0.13 |
| No. 12 | 30 | 0.14 |
| No. 13 | 100 | 0.32 |
| No. 14 | 75 | 0.28 |
| No. 15 | 80 | 0.25 |
| No. 16 | 100 | 0.43 |
| No. 17 | 75 | 0.29 |

Referring to Table 4, in samples Nos. 1 to 12, higher resistance to breakage and higher resistance to wear than in samples Nos. 13 to 17 were confirmed. Samples Nos. 1 to 12 satisfied (1) to (7) whereas samples Nos. 13 to 17 did not satisfy those conditions. It was confirmed from these results that chips according to samples Nos. 1 to 12 representing one example of the present embodiment had high resistance to breakage and high resistance to wear, and hence excellent mechanical characteristics, and achieved stable long life.

In samples Nos. 13, 15, and 17, though a ratio of coarse grains could be lowered by controlling a flow rate of a source gas during formation of α-Al$_2$O$_3$ layer 16, the (001) plane orientation could not be enhanced.

It should be understood that the embodiment disclosed herein is illustrative and non-restrictive in every respect. The scope of the present invention is defined by the terms of the claims, rather than the embodiment above, and is intended to include any modifications within the scope and meaning equivalent to the terms of the claims.

REFERENCE SIGNS LIST

1 rake face; 2 flank face; 3 cutting edge ridgeline portion; 10 surface-coated cutting tool; 11 base material; 11a rake face; 11b flank face; 11c cutting edge ridgeline portion; 12 coating; 13 underlying layer; 14 first intermediate layer; 15 second intermediate layer; 16 α-Al$_2$O$_3$ layer; 30 CVD apparatus; 31 base material setting jig; 32 reaction vessel; 33 thermostat; 34 gas inlet port; 35 gas introduction pipe; 36 through hole; P$_1$ first region; P$_2$ second region; and P$_3$ intermediate point.

The invention claimed is:

1. A surface-coated cutting tool, comprising:
a base material; and
a coating formed on the base material,
the coating including an α-Al$_2$O$_3$ layer containing a plurality of crystal grains of α-Al$_2$O$_3$,
when respective crystal orientations of the crystal grains are specified by performing electron beam backscattering diffraction analyses with a field emission-type scanning microscope on a processed surface which is in parallel to a surface of the α-Al$_2$O$_3$ layer and is obtained by removing the α-Al$_2$O$_3$ layer located in a region extending from the surface by a length not smaller than 0.1 μm and not greater than 0.5 μm in a depth direction and a 15-μm square color map is prepared based on the crystal orientations,
in the color map,
an area A$_1$ occupied by crystal grains A of α-Al$_2$O$_3$ having a particle size not smaller than 1 μm and not greater than 3 μm being equal to or less than 50% and an area A$_2$ in the area A$_1$ occupied by the crystal grains having a normal direction of a (001) plane within ±10° with respect to a normal direction of the processed surface being equal to or more than 90%,
an area B$_1$ occupied by crystal grains B of α-Al$_2$O$_3$ having a particle size not smaller than 0.5 μm and less than 1 μm being equal to or more than 20% and equal to or less than 50% and an area B$_2$ in the area B$_1$ occupied by the crystal grains having a normal direction of the (001) plane within ±10° with respect to the normal direction of the processed surface being equal to or more than 90%, an area $C_1$ occupied by crystal grains C of $\alpha\text{-Al}_2O_3$ having a particle size not smaller than 0.05 μm and less than 0.5 μm being equal to or more than 10% and equal to or less than 50% and an area $C_2$ in the area $C_1$ occupied by the crystal grains having a normal direction of the (001) plane within ±10° with respect to the normal direction of the processed surface being equal to or more than 50%, and a ratio of a total area of the area $A_1$, the area $B_1$ and the area $C_1$ to an area of the entire color map being equal to or more than 95%.

2. The surface-coated cutting tool according to claim 1, wherein
the $\alpha\text{-Al}_2O_3$ layer has a thickness not smaller than 1 μm and not greater than 25 μm.

3. The surface-coated cutting tool according to claim 2, wherein
the $\alpha\text{-Al}_2O_3$ layer has a thickness not smaller than 4 μm and not greater than 15 μm.

4. The surface-coated cutting tool according to claim 1, wherein
the coating includes a first intermediate layer between the base material and the $\alpha\text{-Al}_2O_3$ layer, and
the first intermediate layer is a TiCN layer.

5. The surface-coated cutting tool according to claim 1, wherein
the coating includes a second intermediate layer between the base material and the $\alpha\text{-Al}_2O_3$ layer,
the second intermediate layer is a TiCNO layer or a TiBN layer, and
a difference between a greatest thickness and a smallest thickness of the second intermediate layer is not smaller than 0.3 μm.

6. The surface-coated cutting tool according to claim 1, wherein
the coating includes a surface layer located at an outermost surface, and
the surface layer is a TiC layer, a TiN layer, or a $TiB_2$ layer.

* * * * *